(12) United States Patent
Basker et al.

(10) Patent No.: US 10,236,380 B2
(45) Date of Patent: *Mar. 19, 2019

(54) PRECISE CONTROL OF VERTICAL TRANSISTOR GATE LENGTH

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/668,248

(22) Filed: Aug. 3, 2017

(65) Prior Publication Data

US 2017/0358675 A1  Dec. 14, 2017

Related U.S. Application Data

(63) Continuation of application No. 15/147,194, filed on May 5, 2016, now Pat. No. 9,812,567.

(51) Int. Cl.
*H01L 21/308* (2006.01)
*H01L 29/06* (2006.01)
(Continued)

(52) U.S. Cl.
CPC ...... *H01L 29/7827* (2013.01); *H01L 29/1037* (2013.01); *H01L 29/66553* (2013.01);
(Continued)

(58) Field of Classification Search
None
See application file for complete search history.

(56) References Cited

U.S. PATENT DOCUMENTS 5,128,272 A   7/1992  Ramde
5,326,711 A   7/1994  Malhi
(Continued)

FOREIGN PATENT DOCUMENTS

CA   1271266    7/1990
EP   0951061    10/1999
(Continued)

OTHER PUBLICATIONS

List of IBM Patents or Patent Applications Treated as Related dated Aug. 3, 2017, 2 pages.

*Primary Examiner* — Raj R Gupta
(74) *Attorney, Agent, or Firm* — Tutunjian & Bitetto, P.C.; Vazken Alexanian

(57) ABSTRACT

Transistor and methods of forming the same include forming a channel fin on a bottom source/drain region. A dielectric fill is formed around the channel fin with a gap in an area directly above the channel fin that has a width greater than a width of the channel fin. Spacers are formed in the gap. The dielectric fill is etched away. A gate stack is formed on sidewalls of the channel fin directly underneath the spacers.

11 Claims, 8 Drawing Sheets

(51) Int. Cl.
  *H01L 29/78* (2006.01)
  *H01L 29/66* (2006.01)
  *H01L 29/10* (2006.01)
  *H01L 21/762* (2006.01)
(52) U.S. Cl.
  CPC .. *H01L 29/66666* (2013.01); *H01L 21/76224* (2013.01); *H01L 29/0649* (2013.01)

(56) References Cited

U.S. PATENT DOCUMENTS

| | | | |
|---|---|---|---|
| 6,104,061 A | 8/2000 | Forbes et al. | |
| 6,150,210 A | 11/2000 | Arnold | |
| 6,194,773 B1 | 2/2001 | Malhi | |
| 6,392,271 B1 * | 5/2002 | Alavi | H01L 29/66666 257/302 |
| 6,716,689 B2 | 4/2004 | Bae | |
| 6,746,920 B1 | 6/2004 | Wen | |
| 6,943,407 B2 * | 9/2005 | Ouyang | H01L 21/82380 257/329 |
| 7,176,089 B2 * | 2/2007 | Furukawa | H01L 21/76897 257/E21.41 |
| 7,250,655 B2 | 7/2007 | Bae et al. | |
| 7,560,728 B2 | 7/2009 | Lin et al. | |
| 7,791,068 B2 | 9/2010 | Meng et al. | |
| 8,383,477 B2 | 2/2013 | Lee | |
| 8,404,592 B2 | 3/2013 | Luning et al. | |
| 8,471,310 B2 | 6/2013 | Hynecek | |
| 9,048,329 B2 | 6/2015 | Kim et al. | |
| 9,812,567 B1 * | 11/2017 | Basker | H01L 29/7827 |
| 2003/0015755 A1 | 1/2003 | Hagemeyer | |
| 2008/0197397 A1 | 8/2008 | Parthasarathy et al. | |
| 2011/0006360 A1 | 1/2011 | Ikebuchi | |
| 2012/0187376 A1 * | 7/2012 | Tomioka | B82Y 10/00 257/24 |
| 2012/0214285 A1 | 8/2012 | Guha et al. | |

FOREIGN PATENT DOCUMENTS

| | | |
|---|---|---|
| KR | 1020030042153 | 5/2003 |
| TW | 569378 | 1/2004 |
| WO | 2002086904 | 10/2002 |
| WO | 2005091376 | 9/2005 |
| WO | 12013123287 | 8/2013 |

* cited by examiner

PRECISE CONTROL OF VERTICAL TRANSISTOR GATE LENGTH

BACKGROUND

Technical Field

The present invention generally relates to semiconductor devices and, more particularly, to the use of an L-shaped spacer for decreasing variations in vertical transistor gate length.

Description of the Related Art

Vertical transistors employ channel regions that are oriented generally perpendicular to the plane of an underlying substrate—as opposed to conventional transistors which generally have channel regions that are a part of, or are otherwise parallel to, the underlying substrate. This orientation has significant potential for device scaling, more transistors can fit within a given chip surface area.

However, one challenge in forming a vertical transistor is in controlling the device's gate length. The gate length determines various properties of the final device, and conventional fabrication processes result in significant variation in gate length from one device to the next.

SUMMARY

A method for forming a transistor includes forming a channel fin on a bottom source/drain region. A dielectric fill is formed around the channel fin with a gap in an area directly above the channel fin that has a width greater than a width of the channel fin. Spacers are formed in the gap. The dielectric fill is etched away. A gate stack is formed on sidewalls of the channel fin directly underneath the spacers.

A method for forming a transistor includes etching a substrate around a mask to form a first fin and a bottom source/drain region. A bottom spacer is formed directly on the bottom source/drain region, around the first fin. A channel fin is formed on the bottom source/drain region. The first fin is laterally etched to form the channel fin, such that the mask overhangs sidewalls of the channel fin. A dielectric fill is formed around the channel fin with a gap in an area directly above the channel fin that has a width greater than a width of the channel fin. Spacers having an L-shaped cross-section are formed in the gap. Forming the L-shaped spacers includes forming a dielectric bilayer film in the gap with a bottom film and a top film, etching away horizontal regions of the dielectric bilayer film, and etching away remnant portions of the top film, leaving behind the spacers. A top source/drain region is formed directly on a top surface of the channel fin, between the spacers. The dielectric fill is etched away. A gate stack is formed on sidewalls of the channel fin directly underneath the spacers.

A transistor includes a vertical channel fin directly on a bottom source/drain region. A gate stack is formed on sidewalls of the vertical channel fin. A pair of spacers is formed directly above the gate stack, one above each sidewall of the vertical channel fin. A top source/drain region formed directly on a top surface of the vertical channel fin, between the spacers.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention use a spacer that is formed on top of a vertical transistor's channel region with overhang to protect a gate region from subsequent etch and polish steps. Such etch and polish steps would otherwise cause unpredictability in the gate length. In one particular embodiment, the spacer is formed with an L-shaped cross section.

Figure 1:
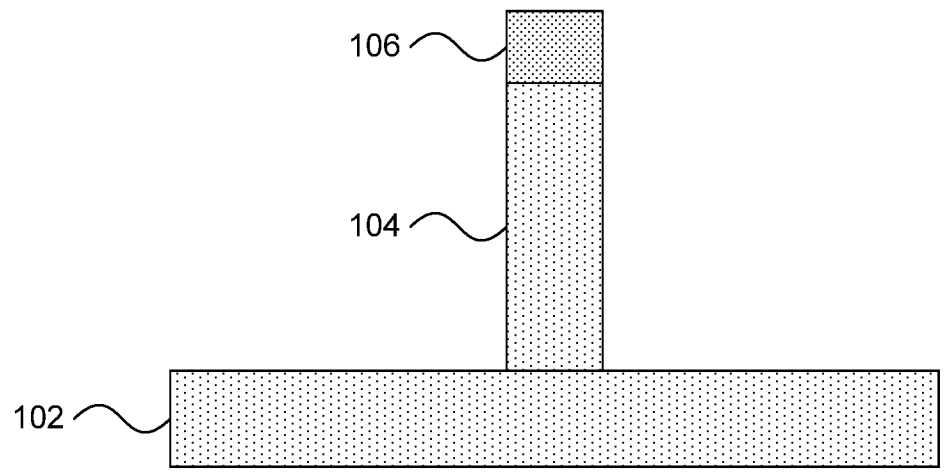
FIG. 1 is a cross-sectional diagram of a step in the formation of a transistor in accordance with the present principles.

Referring now to FIG. 1, a step in forming a vertical transistor is shown. A semiconductor fin 104 is formed from a semiconductor substrate 102 using a hardmask 106 and an anisotropic etch, such as reactive ion etching (RIE). Although it is contemplated that the semiconductor fin 104 may be formed from the same material as the semiconductor substrate 102, it should be understood that different materials may be used.

In one embodiment, the semiconductor substrate 102 is formed from a bulk, silicon-containing material. Illustrative examples of silicon-containing materials suitable for the bulk-semiconductor substrate include, but are not limited to, silicon, silicon germanium, silicon carbide, silicon germanium carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

The semiconductor fin 104 may therefore be any appropriate semiconductor channel material. In addition to the possibilities set forth above, the semiconductor fin 104 may be formed from a III-V compound semiconductor material. The term "III-V compound semiconductor" denotes a semiconductor material that includes at least one element from Group III of the Periodic Table of Elements (International Union of Pure and Applied Chemistry (IUPAC) Group 13) and at least one element from Group V of the Periodic Table of Elements (IUPAC Group 15). Typically, the III-V compound semiconductors are binary, ternary or quaternary alloys including III/V elements. Examples of III-V compound semiconductors that can be used in the present invention include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

A hardmask 106 is used to define the fin 104, with material outside that covered by the hardmask 106 being etched away as shown. It is specifically contemplated that this etch may be performed as part of a shallow trench isolation (STI) process, but it should be understood that other forms of anisotropic etching may be employed instead. As used herein, an "anisotropic etch process" denotes a material removal process in which the etch rate in the direction normal to the surface to be etched is greater than in the direction parallel to the surface to be etched.

STI regions are formed by etching a trench in the substrate utilizing a conventional dry etching process such as RIE or plasma etching. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, fin structure 104 can be formed by spacer imaging transfer processes.

While it is specifically contemplated that the hardmask 106 may be formed from silicon nitride, it should be understood that alternative hardmask materials may include silicon oxides, silicon oxynitrides, silicon carbides, silicon carbonitrides, etc. Spin-on dielectrics may also be utilized as a hardmask material including, but not limited to: silsesquioxanes, siloxanes, and boron phosphate silicate glass (BPSG). The hardmask 106 may be patterned using photolithographic processes, where the hardmask 106 may be produced by applying a photoresist layer to the semiconductor surface, exposing the photoresist layer to a pattern of radiation, and then developing the pattern into the photoresist layer utilizing conventional resist developer.

It should be noted that the substrate region 102 underneath the fin 104 operates as the bottom source/drain region for the device and will be referred to equivalently herein as either the "substrate" or the "bottom source/drain region." The substrate region 102 is therefore doped in accordance with the conductivity type of the device and may be in situ doped or may alternatively be doped by bombardment with a dopant species. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

In a first embodiment, dopant species may be implanted vertically. The hardmask 106 prevents dopant ions from entering the fin 104, and an optional sacrificial spacer may be deposited along the sidewalls of the fin 104 to further insulate the fin 104 from implantation. A thermal anneal is then used to activate the dopant. In a second embodiment, a sacrificial spacer may be used before a source/drain region recess is performed, followed by epitaxial growth of source/drain regions with in situ doping. In a third embodiment, the substrate 102 may be grown with in situ doping prior to patterning the fin 104. In this third embodiment, a doped epitaxial growth is used to form the layer that becomes substrate 102, followed by an undoped epitaxial growth step to form the layer that will later become the fin 104. The depth of the bottom source/drain region may be about 10 nm to about 50 nm deep.

Figure 2:
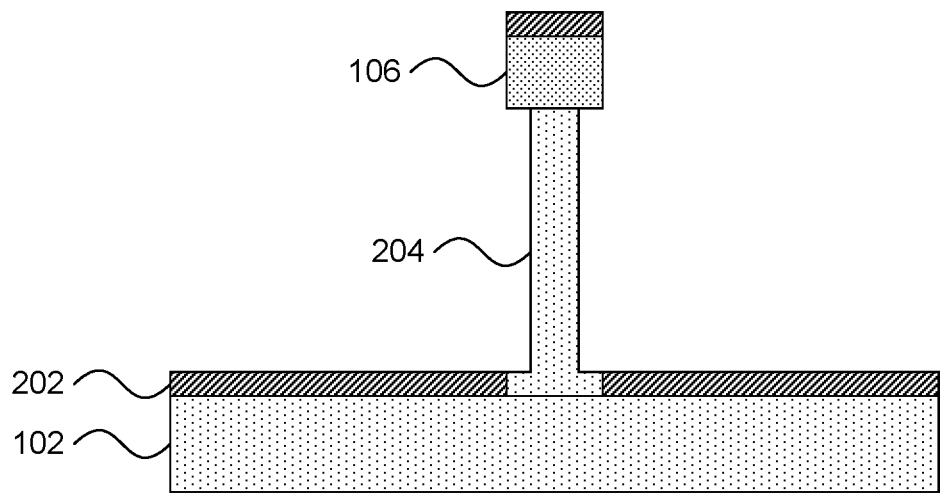
FIG. 2 is a cross-sectional diagram of a step in the formation of a transistor in accordance with the present principles.

Referring now to FIG. 2, a step in forming a vertical transistor is shown. A bottom spacer 202 is deposited over the horizontal surfaces using a directional deposition such as, e.g., high-density plasma CVD (HDPCVD) or physical vapor deposition (PVD). It is specifically contemplated that silicon nitride, silicon oxide or a combination of silicon oxide and silicon nitride may be used as the bottom spacer, but any appropriate dielectric material may be used in its place. The bottom spacer 202 is used to insulate the bottom source/drain region of the substrate 102 from the gate conductor that will be deposited later.

The fin 104 is laterally etched, narrowing to form channel fin 204. The lateral trim of fin 104 may be performed using an isotropic etch such as an isotropic silicon RIE that selectively removes the channel material of the fin 104 and does not affect silicon nitride, silicon dioxide, or other dielectrics that may be present.

Although HDPCVD is specifically contemplated, it should be understood that physical vapor deposition (PVC) or gas cluster ion beam (GCIB) deposition may be used instead. In embodiments that use PVD, a sputtering apparatus may include direct-current diode systems, radio frequency sputtering, magnetron sputtering, or ionized metal plasma sputtering. In embodiments that use GCIB deposition, a high-pressure gas is allowed to expand in a vacuum, subsequently condensing into clusters. The clusters can be ionized and directed onto a surface, providing a highly anisotropic deposition.

Figure 3:
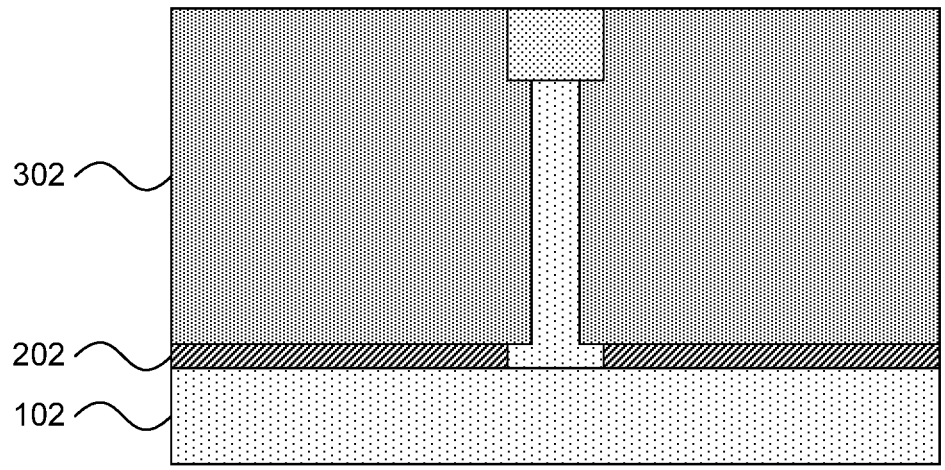
FIG. 3 is a cross-sectional diagram of a step in the formation of a transistor in accordance with the present principles.

Referring now to FIG. 3, a step in forming a vertical transistor is shown. A dielectric fill layer 302 is deposited using, e.g., chemical vapor deposition (CVD). The dielectric material is deposited to a height above that of the hardmask 106 and subsequently polished down using, e.g., a chemical mechanical planarization (CMP) process that stops on the hardmask material. It is specifically contemplated that silicon dioxide may be used for the dielectric fill layer 302, but it should be understood that any appropriate material may be used instead.

It should be understood that, although CVD is specifically contemplated for deposition of the dielectric fill material, PVD, ALD, or GCIB deposition may be used instead. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed.

CMP is performed using, e.g., a chemical or granular slurry and mechanical force to gradually remove upper layers of the device. The slurry may be formulated to be unable to dissolve, for example, the hardmask material, resulting in the CMP process's inability to proceed any farther than that layer.

Figure 4:
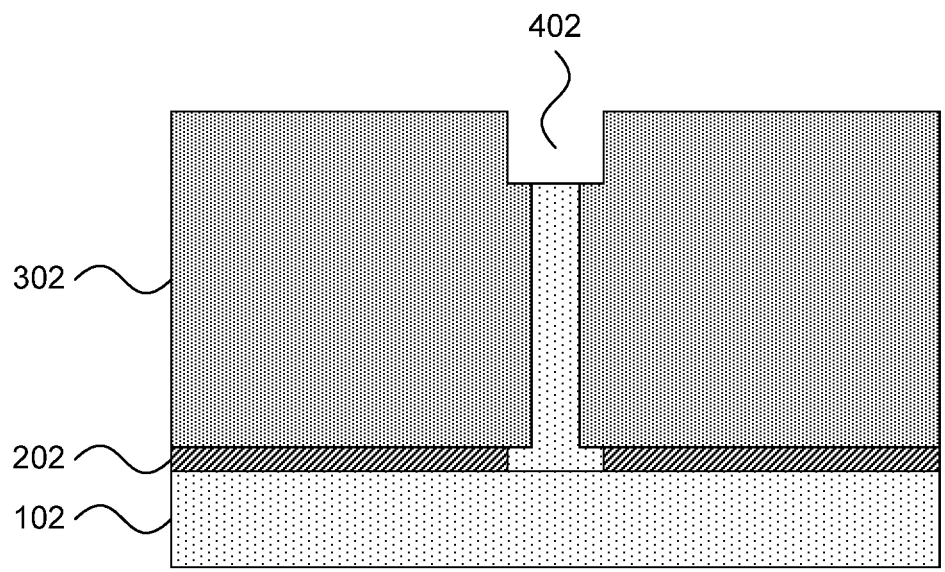
FIG. 4 is a cross-sectional diagram of a step in the formation of a transistor in accordance with the present principles.

Referring now to FIG. 4, a step in forming a vertical transistor is shown. The hardmask 106 is etched away using any appropriate etching process including, e.g., a wet etch or dry etch. The removal of the hardmask 106 leaves behind a gap 402 that exposes the top of fin 204.

Figure 5:
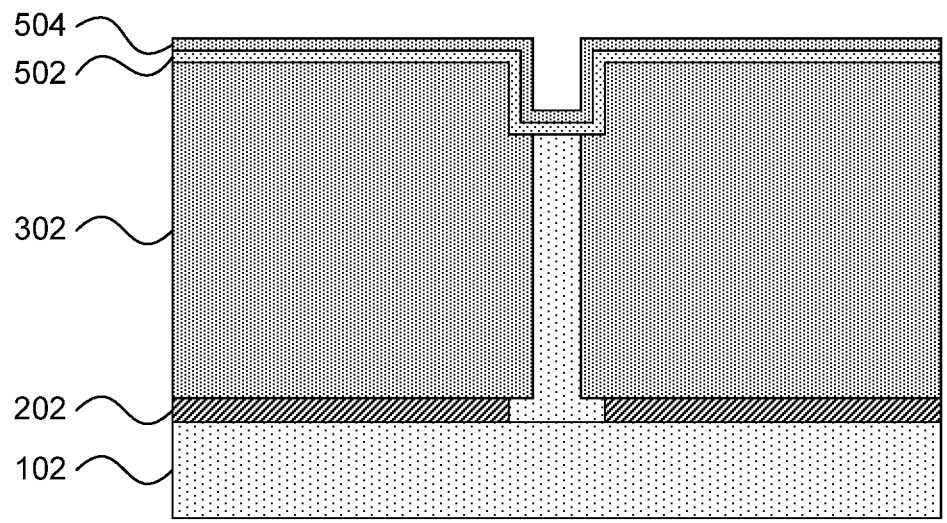
FIG. 5 is a cross-sectional diagram of a step in the formation of a transistor in accordance with the present principles.

Referring now to FIG. 5, a step in forming a vertical transistor is shown. A first film 502 is conformally deposited in the gap 402 using, e.g., a low-k dielectric or silicon nitride, although it should be understood that any appropriate material may be used instead. A low-k dielectric is a material having a dielectric constant k that is lower than that of silicon dioxide. A second film 504 is deposited conformally over the first film 502 and may be formed from, e.g., silicon dioxide, though it should be understood that any appropriate material may be used instead.

Figure 6:
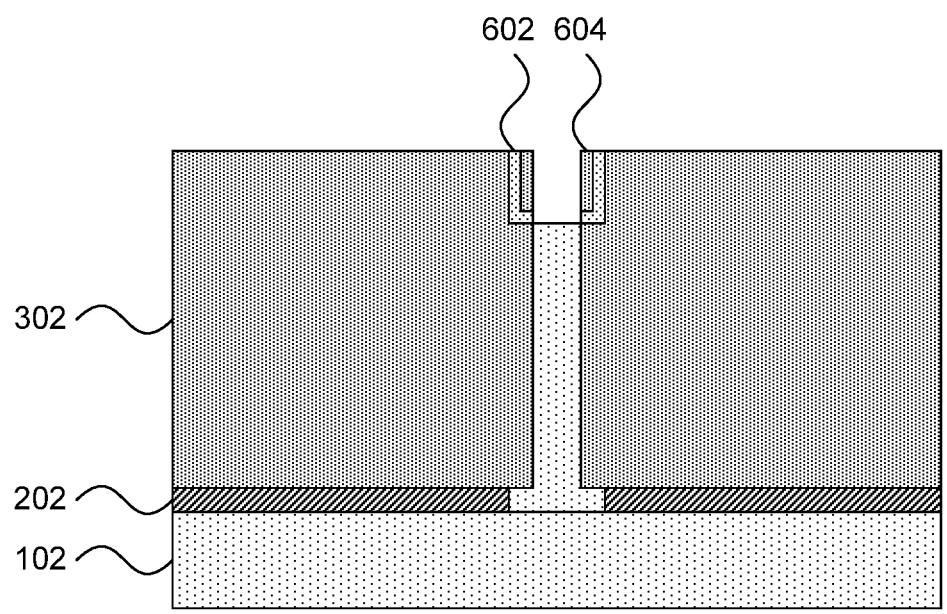
FIG. 6 is a cross-sectional diagram of a step in the formation of a transistor in accordance with the present principles.

Referring now to FIG. 6, a step in forming a vertical transistor is shown. The first and second films 502 and 504 are etched using a timed anisotropic etching process to remove material from exposed horizontal surfaces. This etch leaves spacers 602 having an L-shaped cross section as well as remnants 604 of the second film. A portion of the top surface of the fin 204 is exposed between the spacers 602.

Figure 7:
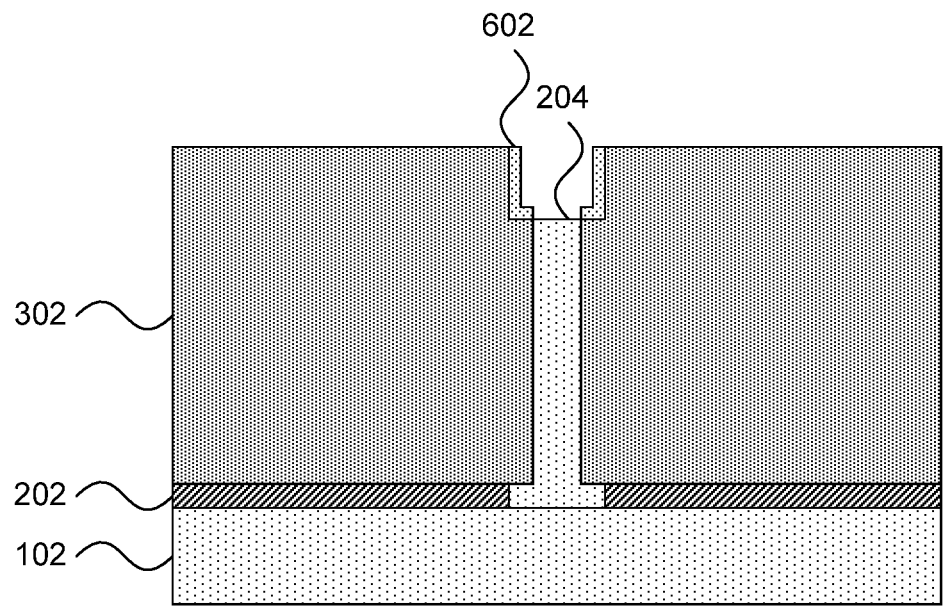
FIG. 7 is a cross-sectional diagram of a step in the formation of a transistor in accordance with the present principles.

Referring now to FIG. 7, a step in forming a vertical transistor is shown. The remnants 604 of the second film are removed using any appropriate etch. It is specifically contemplated that a wet or dry etch is used that is selective to the remnants 604. As used herein, the term "selective" in reference to a material removal process denotes that the rate of material removal for a first material is greater than the rate of removal for at least another material of the structure to which the material removal process is being applied. The spacers 602 and the fin 204 therefore remain undamaged by removal of the remnants 604.

The exposed portion of the fin 204 may be doped by ion bombardment. Optional implantation of a shallow layer of the top portion of the channel fin 204 is performed to improve the electrical junction with the subsequently formed top source/drain region.

Figure 8:
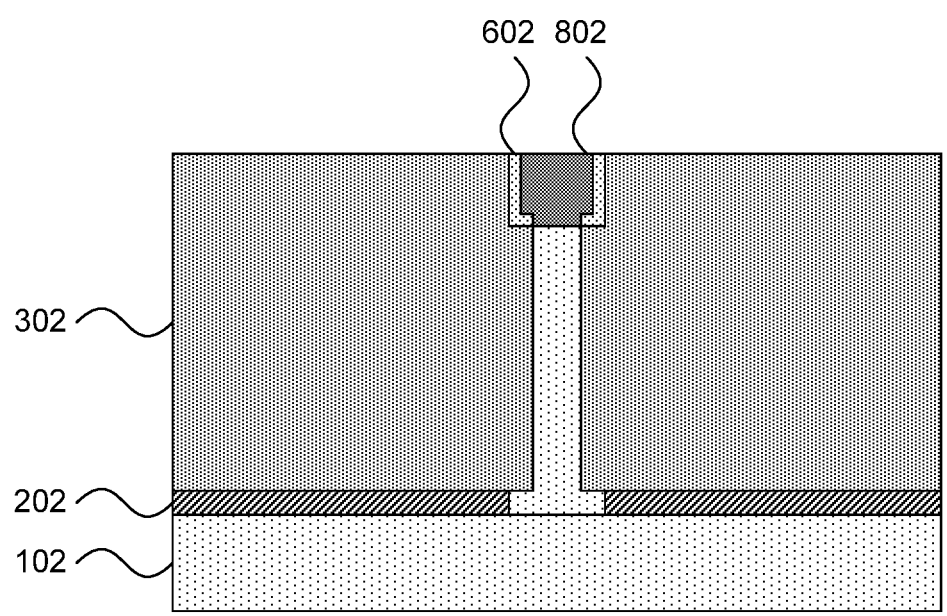
FIG. 8 is a cross-sectional diagram of a step in the formation of a transistor in accordance with the present principles.

Referring now to FIG. 8, a step in forming a vertical transistor is shown. A top source/drain region 802 is formed on the fin 204, between the spacers 602. It is specifically contemplated that the top source/drain region 802 may be epitaxially grown from the fin 204. The top source/drain region 802 may be doped in situ or via an implantation process.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In some embodiments, in which the epitaxial semiconductor material of the top source/drain region 802 is composed of silicon, the silicon gas source for epitaxial deposition may be selected from the group consisting of hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. In some embodiments, in which the epitaxial semiconductor material of the top source/drain region 802 is composed of germanium, the germanium gas source for epitaxial deposition may be selected from the group consisting of germane, digermane, halogermane, dichlorogermane, trichlorogermane, tetrachlorogermane, and combinations thereof. In some embodiments, in which the epitaxial semiconductor material of the top source/drain region 802 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof, and the germanium gas sources may be selected from the group consisting of germane, digermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 40%.

Figure 9:
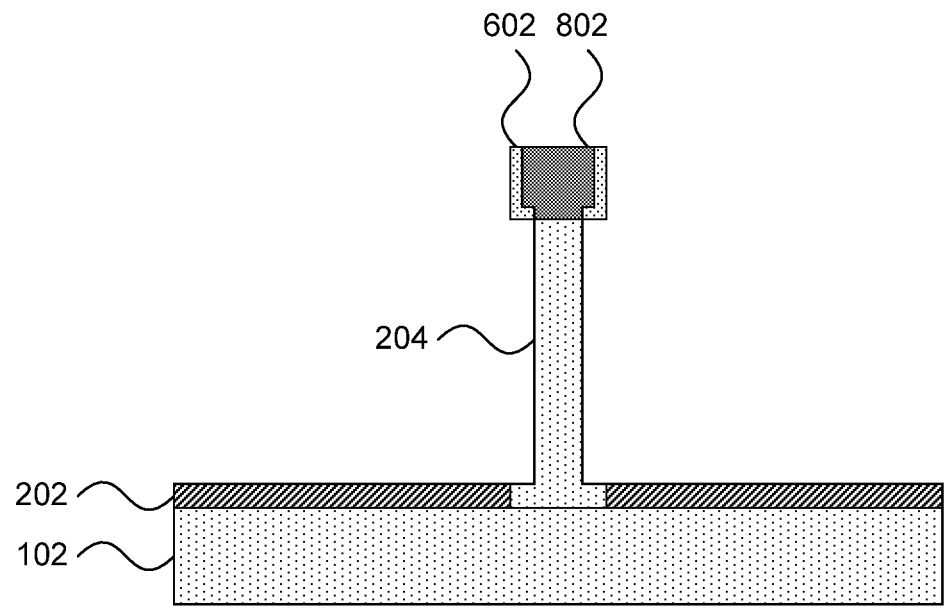
FIG. 9 is a cross-sectional diagram of a step in the formation of a transistor in accordance with the present principles.

Referring now to FIG. 9, a step in forming a vertical transistor is shown. The oxide fill 302 is selectively etched away, exposing the underlying spacer 202 and the sidewalls of the vertical channel fin 204.

Figure 10:
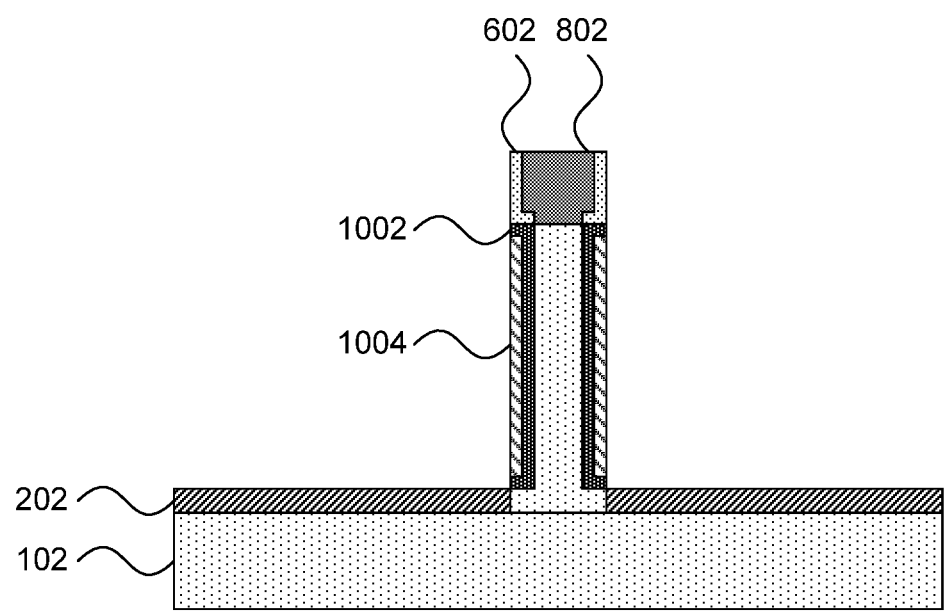
FIG. 10 is a cross-sectional diagram of a step in the formation of a transistor in accordance with the present principles.

Referring now to FIG. 10, a step in forming a vertical transistor is shown. A gate dielectric layer 1002 is conformally formed on the vertical channel fin 204. It is specifically contemplated that the gate dielectric layer 1002 may be formed from a high-k dielectric, which is a material having a dielectric constant k that is higher than that of silicon dioxide. A gate 1004 is deposited over the gate dielectric layer 1002. It is specifically contemplated that the gate 1004 may be formed from a work function metal layer. The gate dielectric layer 1002 and the gate 1004 together form a gate stack and may include any other layers appropriate to the stack.

It is specifically contemplated that the gate dielectric layer 1002 may be formed from an oxide of hafnium, but it should be understood that any appropriate high-k dielectric may be used, with examples including oxides of tantalum, zirconium, or aluminum.

In the case of a p-type device, the work function metal layer effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal layer may be composed of titanium and its nitride/carbide. In one specific embodiment, the p-type work function metal layer is composed of titanium nitride. The p-type work function metal layer may also be composed of titanium aluminum nitride, ruthenium, platinum, molybdenum, cobalt, and alloys and combinations thereof.

In an n-type device, the work function metal layer effectuates an n-type threshold voltage shift. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of titanium aluminum, tantalum nitride, titanium nitride, hafnium nitride, hafnium silicon, or combinations thereof.

It is specifically contemplated that the gate dielectric layer 1002 and the gate 1004 are deposited using an isotropic deposition process such as CVD. Excess material is subsequently anisotropically etched away from any surface not covered by the spacers 602.

Figure 11:
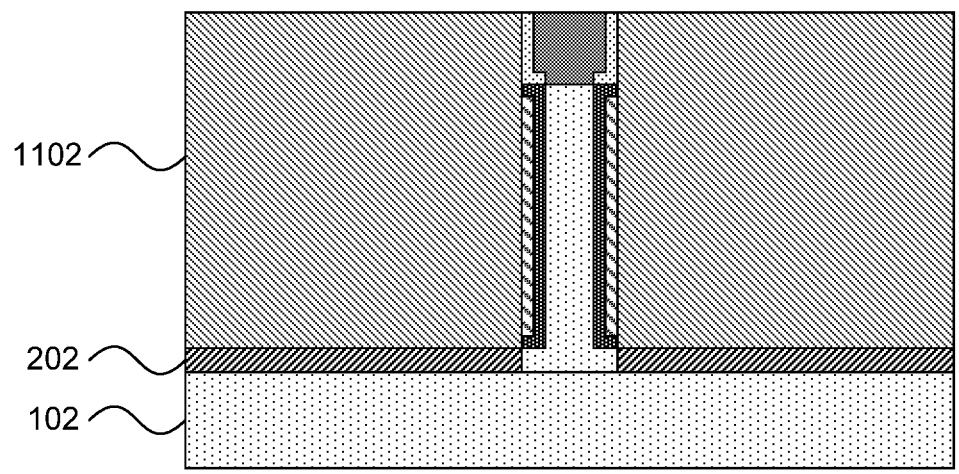
FIG. 11 is a cross-sectional diagram of a step in the formation of a transistor in accordance with the present principles.

Referring now to FIG. 11, a step in forming a vertical transistor is shown. A conductor 1102 is filled in around the transistor device. It is specifically contemplated that tungsten may be used as the conductor 1102, but any appropriate conductive material may be used instead. The conductor 1102 may be deposited using any appropriate deposition process including one of, e.g., CVD, PVD, ALD, or GCIB deposition, and subsequently polished down to the level of the top of the spacers 602 and the top source/drain region 802 using, e.g., CMP.

Figure 12:
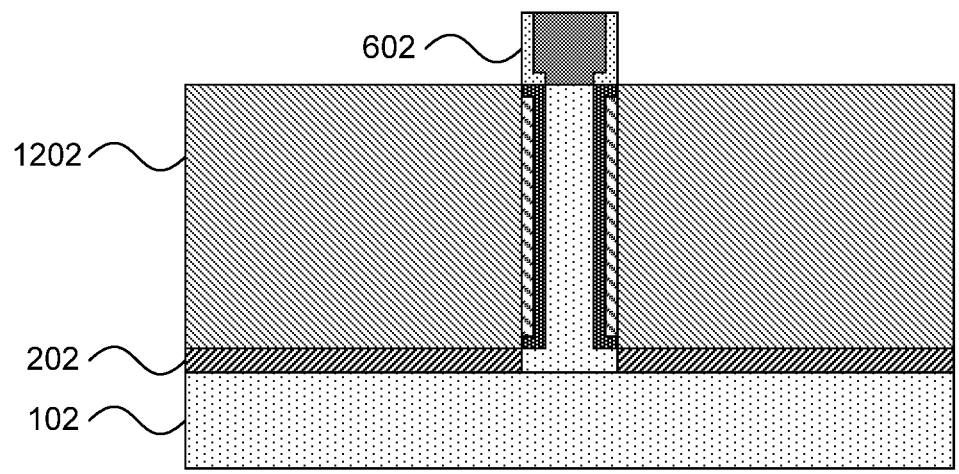
FIG. 12 is a cross-sectional diagram of a step in the formation of a transistor in accordance with the present principles.

Referring now to FIG. 12, a step in forming a vertical transistor is shown. The conductor 1102 is anisotropically etched back to the level of the gate dielectric 1002. The etch back process is generally difficult to control with precision. The spacers 602 protect the gate dielectric 1002 and the gate 1004 from the etch back, such that the length of these features can be precisely controlled and repeatably produced. The remaining conductor 1202 forms an electrical contact to the gate 1004.

Figure 13:
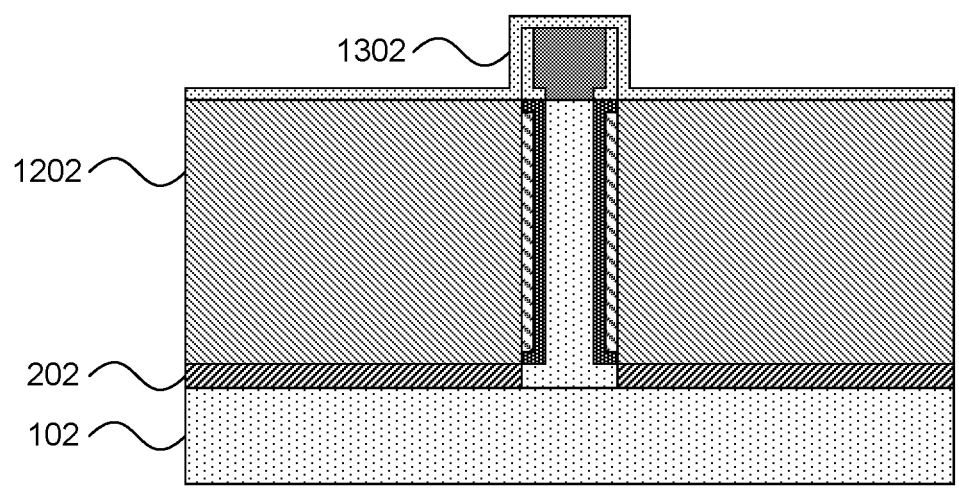
FIG. 13 is a cross-sectional diagram of a step in the formation of a transistor in accordance with the present principles.

Referring now to FIG. 13, a step in forming a vertical transistor is shown. A passivating layer 1302 is deposited conformally over the conductor 1202 and the top source/drain region 802. It is specifically contemplated that the passivating layer 1302 may be formed from silicon nitride, but it should be understood that any appropriate dielectric material may be used instead.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 14:
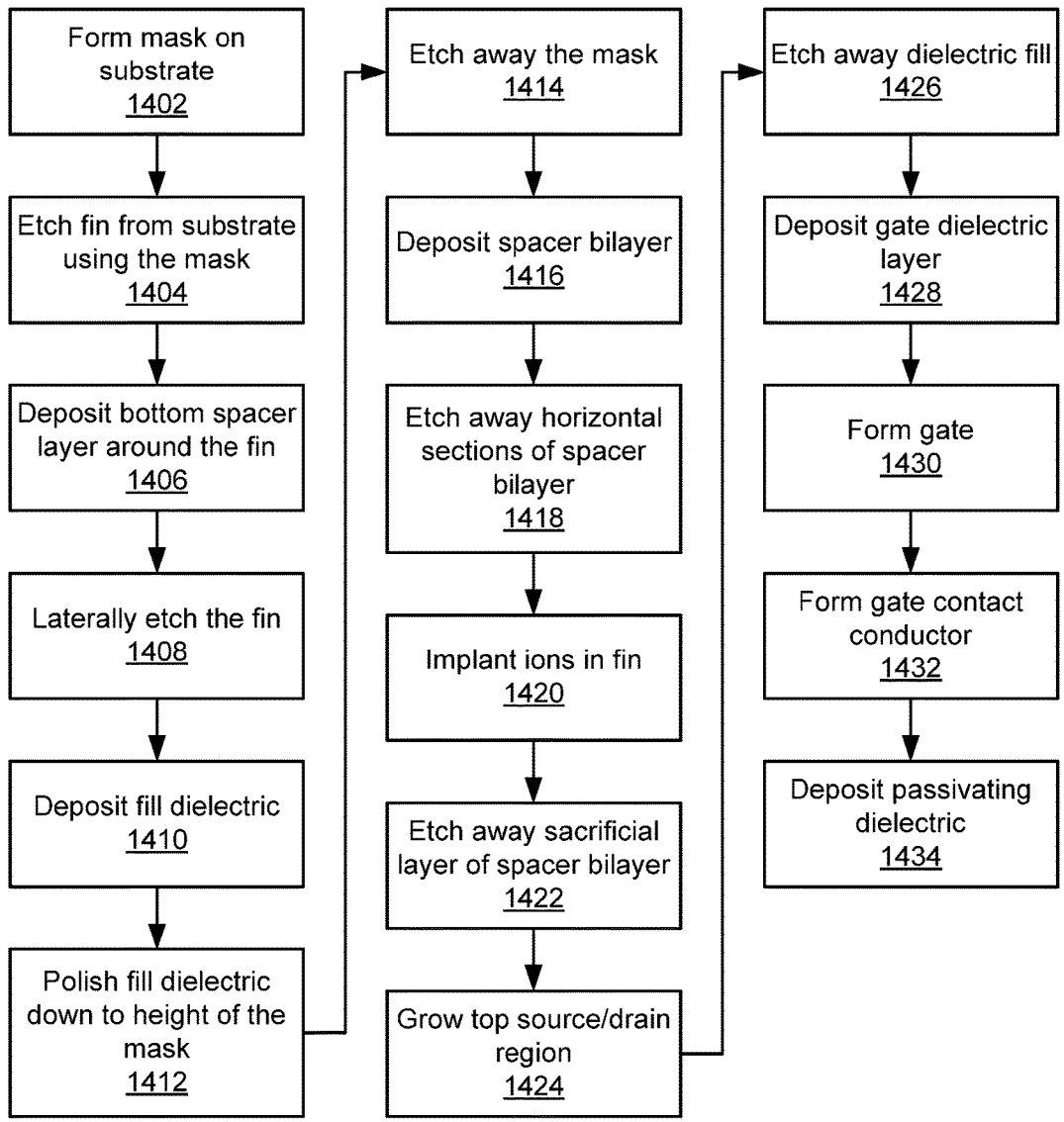
FIG. 14 is a block/flow diagram of a method of forming a transistor in accordance with the present principles.

Referring now to FIG. 14, a method for fabricating a vertical transistor is shown. Block 1402 forms a mask 106 on a layer of semiconductor material. As noted above, the mask defines a fin region, and block 1404 etches the fin 104 from the semiconductor material, leaving bottom source/drain region 102. It should be noted that the semiconductor material may be doped prior to formation of the fin 104 or, alternatively, the bottom source/drain region 102 may be doped by implantation after forming the fin 104.

Block 1406 deposits the bottom spacer layer 202 on the bottom source/drain region 102 around the fin 104. The fin 104 is then laterally etched to form trimmed channel fin 204 in block 1408. A dielectric fill 302 is deposited around the channel fin 204 and the mask 106 in block 1410. The dielectric fill 302 is then polished down to the height of the mask 106 in block 1412 and the mask 106 is etched away in block 1414.

Block 1416 conformally deposits the spacer bilayer in the gap 402 left when the mask 106 was etched away. The spacer bilayer includes the first film 502 and the second film 504. Block 1418 then etches away the horizontal sections of the spacer bilayer using an anisotropic etch and block. Block 1420 implants ions in the fin 204 as described above.

Block 1422 etches away the sacrificial remnants 604 of the second spacer film 504, leaving behind the spacers 602, which have an L-shaped cross-section. Block 1424 then epitaxially grows the top source/drain region 802 from the top surface of the channel fin 204. It is specifically contemplated that the top source/drain region 802 may be in situ doped during the growth process, but in an alternative embodiment the top source/drain region may be doped by an implantation process.

Block 1426 etches away the dielectric fill to expose the sidewalls of the channel fin 204. Block 1428 deposits the gate dielectric layer 1002 using a conformal deposition process such as, e.g., CVD. Block 1430 then forms the gate 1004 from an appropriate material such as a work function metal. Any leftover material from the formation of the gate dielectric layer 1002 and the gate 1004 are then etched away, leaving a gate of precise length under the spacers 602. Block 1432 deposits a gate contact conductor material such as tungsten and polishes and etches the gate contact conductor material down to the top level of the gate dielectric layer 1002. It should be noted that the presence of the spacers 602 protect the underlying gate 1004 and gate dielectric layer 1002 from the polish and etch back of the gate conductor 1202. Block 1434 then deposits a passivating dielectric layer 1302 over the gate conductor 1202 and the top source/drain region 802, encapsulating the device.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a transistor, comprising:
   forming a dielectric fill around a fin, said dielectric fin having a gap in an area directly above the fin, said gap having a width greater than a width of the fin;
   forming spacers in the gap;
   etching away the dielectric fill; and
   forming a gate stack on sidewalls of the fin underneath the spacers.

2. The method of claim 1, wherein the spacers have an L-shaped cross-section.

3. The method of claim 2, wherein forming the spacers comprises conformally forming a dielectric bilayer film in the gap.

4. The method of claim 3, wherein forming the spacers further comprises etching away horizontal regions of the dielectric bilayer film.

5. The method of claim 4, wherein forming the spacers comprises etching away a remnant portion of a top film of the dielectric bilayer film, leaving behind the spacers.

6. The method of claim 3, wherein the dielectric bilayer film comprises a bottom film of silicon nitride and a top film of silicon dioxide.

7. The method of claim 1, further comprising forming a top source/drain region directly on a top surface of the fin, between the spacers.

8. The method of claim 1, further comprising forming the fin, including etching a substrate around a mask to form a first fin.

9. The method of claim 8, further comprising forming a bottom spacer directly on the bottom source/drain region around the first fin.

10. The method of claim 9, wherein forming the fin further comprises laterally etching the first fin to form a channel fin, such that the mask overhangs sidewalls of the channel fin.

11. The method of claim 8, further comprising etching away the mask after deposition of dielectric fill material to form the gap.

* * * * *